(12) United States Patent
Fowler et al.

(10) Patent No.: US 11,997,824 B2
(45) Date of Patent: May 28, 2024

(54) SYSTEMS AND METHODS FOR PROVIDING A HIGH PERFORMANCE AIR-COOLED CHASSIS FOR ELECTRONIC MODULES

(71) Applicant: Eagle Technology, LLC, Melbourne, FL (US)

(72) Inventors: Clarke O. Fowler, Merritt Island, FL (US); David J. Sugimoto, Indialantic, FL (US)

(73) Assignee: Eagle Technology, LLC, Melbourne, FL (US)

( * ) Notice: Subject to any disclaimer, the term of this patent is extended or adjusted under 35 U.S.C. 154(b) by 170 days.

(21) Appl. No.: 17/889,759

(22) Filed: Aug. 17, 2022

(65) Prior Publication Data

US 2024/0064930 A1 Feb. 22, 2024

(51) Int. Cl.
*H05K 7/20* (2006.01)
(52) U.S. Cl.
CPC ..... *H05K 7/20154* (2013.01); *H05K 7/20172* (2013.01); *H05K 7/20736* (2013.01)
(58) Field of Classification Search
CPC ........... H05K 7/20154; H05K 7/20172; H05K 7/20736
See application file for complete search history.

(56) References Cited

U.S. PATENT DOCUMENTS

| | | | |
|---|---|---|---|
| 3,278,250 A | 10/1966 | Vogt | |
| 4,508,405 A | 4/1985 | Damon et al. | |
| 4,751,963 A | 6/1988 | Bui et al. | |
| 4,800,956 A | 1/1989 | Hamburgen | |
| 4,858,070 A * | 8/1989 | Buron | H05K 7/1461 361/736 |
| 4,869,680 A | 9/1989 | Yamamoto et al. | |
| 4,953,058 A * | 8/1990 | Harris | H05K 7/1461 361/744 |
| 4,994,937 A | 2/1991 | Morrison | |
| 5,414,593 A | 5/1995 | Furlan | |
| 5,967,824 A | 10/1999 | Neal et al. | |

(Continued)

OTHER PUBLICATIONS

Brookstein, D., et al., "Experimental method for determining thermal resistance of heatsinks for standard electronic module applications," International SAMPE Electronics Conference, Albany Int Research Co., ISECE8. published 1994.

(Continued)

*Primary Examiner* — Mukundbhai G Patel
(74) *Attorney, Agent, or Firm* — Fox Rothschild LLP; Carol E. Thorstad-Forsyth

(57) ABSTRACT

Systems and methods for facilitating temperature regulation of an electronic module. The methods comprise: coupling first heat exchanger modules of a plurality of heat exchanger modules together to form a first set of heat exchanger modules and second heat exchanger modules of the plurality of heat exchanger modules together to form a second set of heat exchanger modules; using frame members to structurally support and maintain the first and second sets of heat exchanger modules in a spaced apart arrangement; and providing at least one slot between corresponding spaced apart modules of the first and second heat exchanger modules, the at least one slot being sized and shaped to receive the electronic module to facilitate the temperature regulation via the plurality of heat exchanger modules.

20 Claims, 15 Drawing Sheets

(56) References Cited

U.S. PATENT DOCUMENTS

| | | |
|---|---|---|
| 6,343,009 B1 | 1/2002 | Liu et al. |
| 6,398,042 B1 | 6/2002 | Tabuchi |
| 6,483,107 B1 | 11/2002 | Rabinovitz et al. |
| 6,721,182 B1 | 4/2004 | Wells et al. |
| 8,477,498 B2 | 7/2013 | Porreca et al. |
| 8,482,695 B2 | 7/2013 | Dunn |
| 8,743,543 B2 | 6/2014 | Clidaras et al. |
| 9,615,479 B2 | 4/2017 | Peng et al. |
| 10,042,396 B1 | 8/2018 | Gupta et al. |
| 10,212,850 B1 | 2/2019 | Wells et al. |
| 2002/0114139 A1 | 8/2002 | Bash et al. |
| 2003/0161108 A1 | 8/2003 | Bright et al. |
| 2003/0169983 A1 | 9/2003 | Branch et al. |
| 2009/0083972 A1 | 4/2009 | Colbert et al. |
| 2009/0213540 A1 | 8/2009 | Zhang et al. |
| 2010/0020514 A1 | 1/2010 | Lee et al. |
| 2011/0058335 A1 | 3/2011 | Sullivan et al. |
| 2011/0267776 A1 | 11/2011 | Porreca et al. |
| 2012/0236490 A1 | 9/2012 | Xia |
| 2014/0102626 A1 | 4/2014 | Clayton et al. |
| 2014/0104776 A1 | 4/2014 | Clayton et al. |
| 2014/0111070 A1 | 4/2014 | Ehlen |
| 2014/0248028 A1 | 9/2014 | Campbell et al. |
| 2015/0168087 A1 | 6/2015 | Kim et al. |
| 2016/0278521 A1 | 9/2016 | Chen |
| 2018/0054909 A1 | 2/2018 | Chen |
| 2019/0254199 A1 | 8/2019 | Lipp et al. |

OTHER PUBLICATIONS

Extended European Search Report dated Oct. 4, 2019, Application Serial No. EP19179776.0 in the name of Eagle Technology, LLC.

* cited by examiner

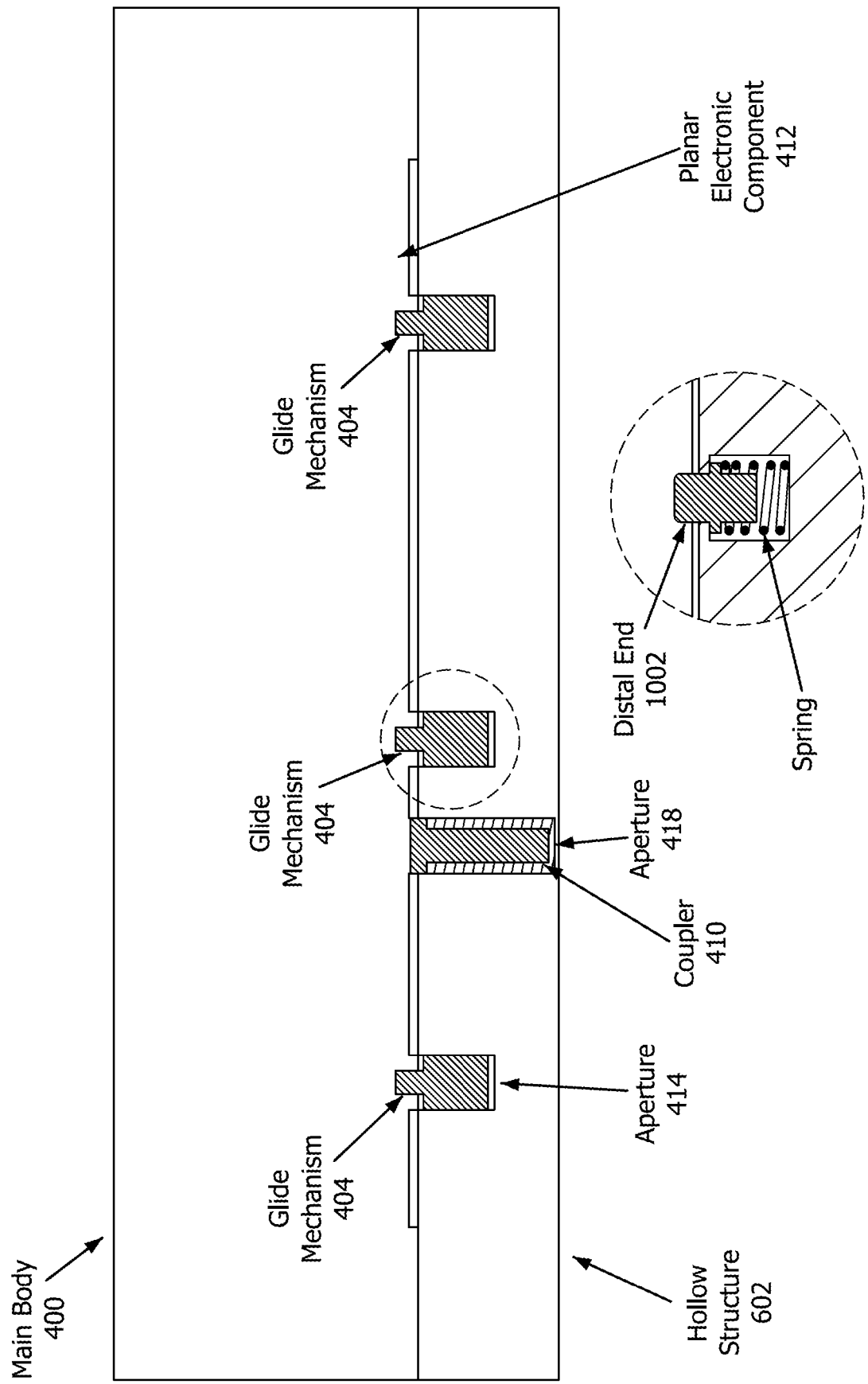

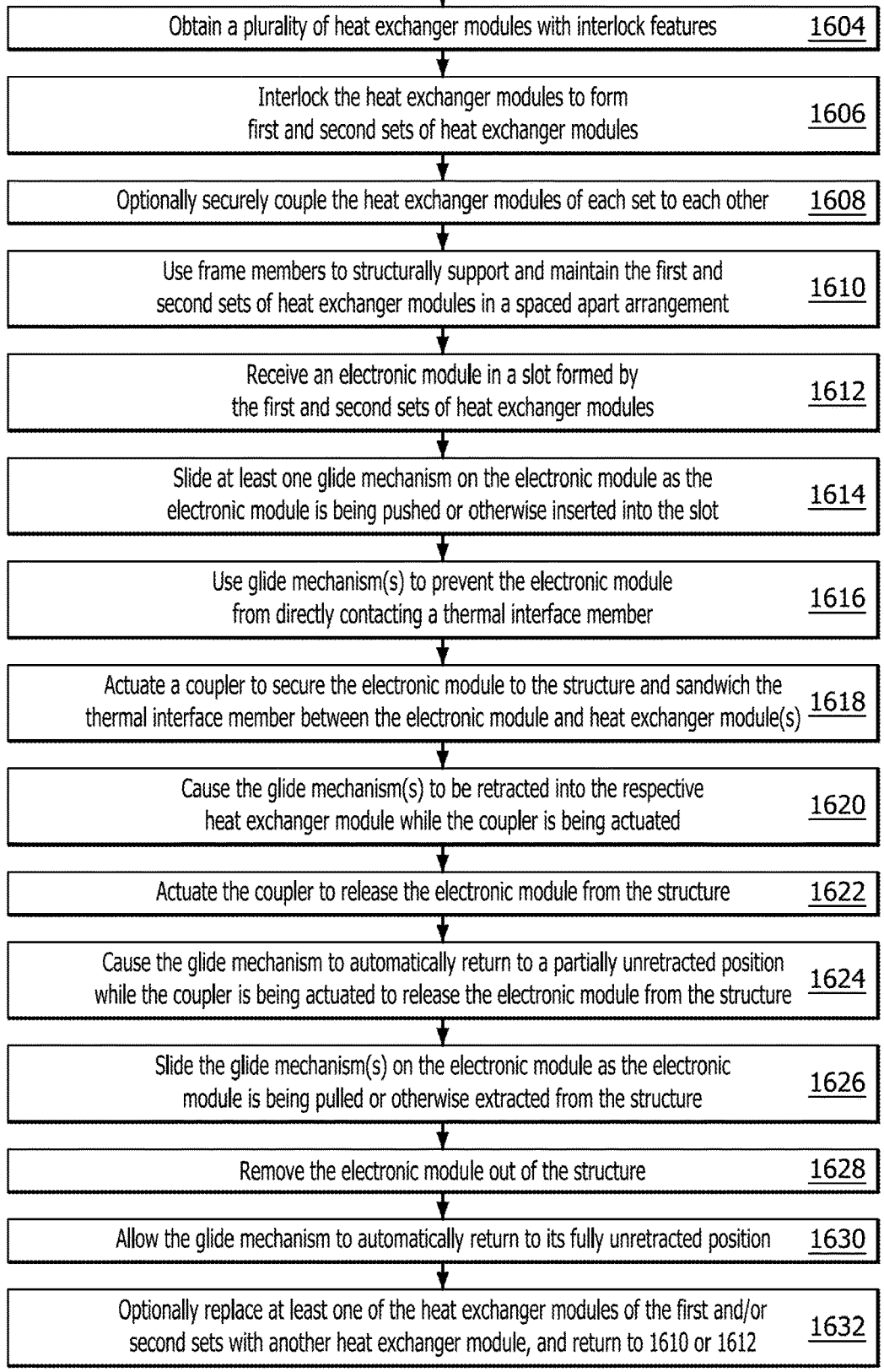

SYSTEMS AND METHODS FOR PROVIDING A HIGH PERFORMANCE AIR-COOLED CHASSIS FOR ELECTRONIC MODULES

BACKGROUND

Statement of the Technical Field

The present document concerns to electronic systems. More specifically, the present document concerns systems and methods for providing a high-performance air-cooled chassis for plug-in electronic modules.

Description of the Related Art

Thermal resistance across a heatsink-rail interface is a known thermal bottleneck for plug-in Conduction Cooled Modules (CCMs). The thermal resistance often drives design parameters in other areas of the system. For example, the burden to provide more cooling is often placed at the system level, rather than the module level. Improved retainers can be employed to facilitate the increased cooling. However, these improved retainers are relatively expensive as compared to standard wedgelock clamping mechanisms.

Power dissipation is a critical concern for CCMs in rugged environments. CCM VITA standards are insufficient for high power dissipation (typically limited to <100 Watts, less for space applications). Modules are now being created in excess of 100 Watts. This is very challenging in both avionics and space applications. Modules are proposed for further systems that approach >200 Watts.

The current state of the art utilizes card clamps, such as retainer edge locks (commonly referred to as wedgelocks) to secure CCMs to a chassis or other structure. Such wedgelocks include, but are not limited to, a Series 260 card lock available from Calmark™ Corporation (now part of Pentair's Schroff brand) of San Diego, California, a Series 280 card lock available from Calmark™ Corporation, a Coollok® wedgelock available from Material Innovations, Inc. of Huntington Beach, California, and a wedgelock available from WaveTherm® of Raleigh, North Carolina. These devices use mechanical advantage (incline plane) to generate a clamping force for clamping a CCM between the wedgelock and a chassis or other structure surface.

Despite the provision of a large contact force by the wedgelocks, the materials being clamped dominate the resistance of heat transfer across the thermal interface. The resistance is a function of surface roughness, plating, flatness, etc. The thermal interface resistance range for wedgelocks (e.g., 0.3-0.6° C./Watt) can be detrimental for high power loads. This translates to a 15-30° C. temperature variation across the wedgelock's thermal interface for a 100 Watt CCM (50 W being dissipated across each interface). Additionally, the thermal interface resistance increases as the wedgelock become longer as a result of uneven wedge loading. As a result of the above limitations, wedglock implementations require well machined heatsink/chassis interfaces, which translates to higher costs.

SUMMARY

This document concerns systems and methods for facilitating temperature regulation of an electronic module. The methods comprise: coupling first heat exchanger modules of a plurality of heat exchanger modules together to form a first set of heat exchanger modules; coupling second heat exchanger modules of the plurality of heat exchanger modules together to form a second set of heat exchanger modules; using frame members to structurally support and maintain the first and second sets of heat exchanger modules in a spaced apart arrangement; and providing slot(s) between corresponding spaced apart modules of the first and second heat exchanger modules. The slot(s) being sized and shaped to receive electronic module(s) to facilitate the temperature regulation via the heat exchanger modules.

In some scenarios, the coupling comprises: slidingly receiving a heat exchanger module in a channel of another heat exchanger; interlocking adjacent ones of the first or second heat exchanger modules to each other; and/or securely joining the first heat exchanger modules to each other and the second heat exchanger modules to each other via brazing or other means after the interlocking or coupling.

In those or other scenarios, the methods also comprise: receiving the electronic module in the slot; sliding glide mechanism(s) on the electronic module as the electronic module is being inserted into the slot; using the glide mechanism(s) to prevent direct contact between the electronic module and a thermal interface member disposed on one of the corresponding spaced apart modules; allowing the thermal interface member to be sandwiched between the electronic module and one of the corresponding spaced apart modules; and/or allowing the glide mechanism(s) to be retracted into one of the corresponding spaced apart modules as the thermal interface module is being sandwiched between the electronic module and one of the corresponding spaced apart modules.

In those or other scenarios, the first and second heat exchanger modules are interchangeable with each other and other third heat exchanger modules. As such, the method may further comprise replacing one of the first or second heat exchanger modules with one of the third each exchanger modules. This replacement may occur after the electronic module has been removed from the slot.

This document also concerns a structure. The structure can include, but is not limited to, a chassis for plug-in electronic modules. The structure comprises: frame member(s); a plurality of heat exchanger modules coupled together to form first and second sets of heat exchanger modules; and a thermal interface member coupled to each heat exchanger module. The heat exchanger modules and thermal interface member are both configured to facilitate temperature regulation of an electronic module when the electronic module is disposed in the structure. The terminal interface member can include, but is not limited to, a planar electronic component (for example, a thermally conductive plate) and/or a thermal interface material.

The frame member(s) structurally support(s) and maintain(s) the first and second sets of heat exchanger modules in a spaced apart arrangement such that slot(s) is(are) provided in the structure that is sized and shaped to receive the electronic module. For example, each frame member may be designed to surround and frictionally engage at least three sides of each first and second sets of heat exchanger modules. Each heat exchanger module comprises a main body that is formed of a thermally conductive material and has first structural feature(s) configured to engage second structural feature(s) of another one of the heat exchanger modules to facilitate formation of the first or second sets of heat exchanger modules.

In some scenarios, the heat exchanger modules are interchangeable with each other. The size of each frame member may be adjustable to accommodate different sized sets of heat exchanger modules. Additionally or alternatively, different sized frame members are provided for use with the different sized sets of heat exchanger modules, respectively. A heat exchanger module may optionally be removed or added to each of the first and second sets, for example, after being structurally supported by the frame member(s) and/or prior to when the size of the frame member(s) is(are) adjusted.

In those or other scenarios, the second structural feature is configured to slidingly receive the first structural feature to cause an interlocking between two adjacent heat exchanger modules. Additionally or alternatively, glide mechanism(s) may be disposed in the main body of each heat exchanger module. Each glide mechanism is transitioned between an unretracted position in which a portion of the glide mechanism protrudes out and away from the main body and a retracted position in which the position of the glide mechanism is retracted into the main body. Each glide mechanism is configured to prevent the electronic module from directly contacting the thermal interface member when being inserted and removed from a respective slot. The thermal interface member may be coupled to the heat exchanger module at a location to allow the thermal interface member to be sandwiched between the electronic module and the heat exchanger module when the heat exchanger module is disposed in the structure. Each glide mechanism is configured to transition to the retracted position when the thermal interface module is being sandwiched between the electronic module and the heat exchanger module.

BRIEF DESCRIPTION OF THE DRAWINGS

This disclosure is facilitated by reference to the following drawing figures, in which like numerals represent like items throughout the figures.

FIG. 10A and FIG. 10B provides an illustration that is useful for understand how the glide mechanisms are disposed in the main body of a heat exchanger module, as well as their positions relative to the heatsink plate.

FIG. 16 provides a flow diagram of a method for facilitating temperature regulation of an electronic module.

DETAILED DESCRIPTION

Figure 1:
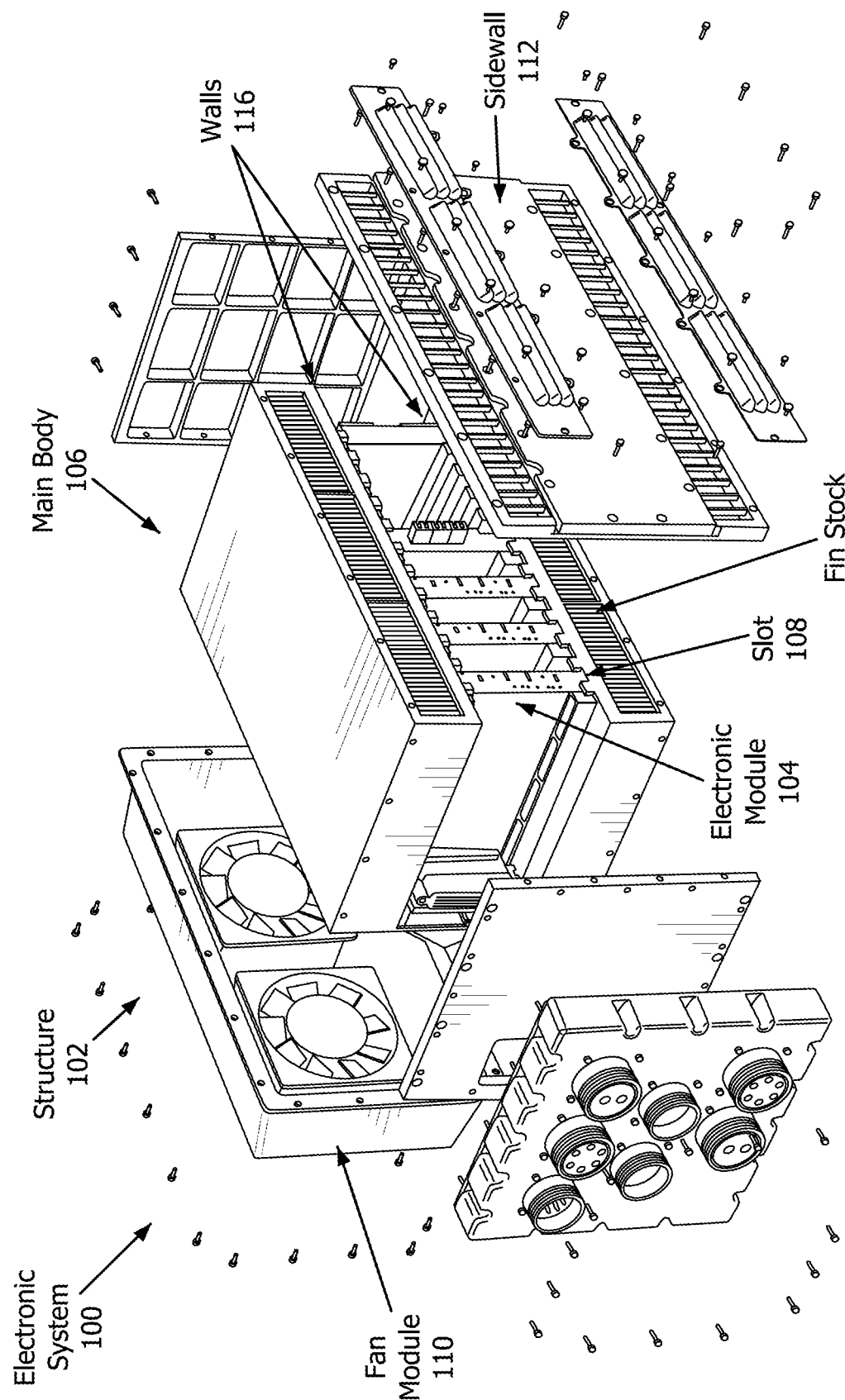
FIG. 1 provides an illustration showing an electronic system.

It will be readily understood that the solution described herein and illustrated in the appended figures could involve a wide variety of different configurations. Thus, the following more detailed description, as represented in the figures, is not intended to limit the scope of the present disclosure, but is merely representative of certain implementations in various different scenarios. While the various aspects are presented in the drawings, the drawings are not necessarily drawn to scale unless specifically indicated.

Reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

The present solution generally concerns systems and methods for providing a chassis support structure for electronic modules with an improved fabrication process and an improved thermal interface to the electronic modules. The improved fabrication process is achieved by the novel design of interchangeable heat exchanger modules. The heat exchanger modules can be interlocked or otherwise coupled to each other to form a combined heatsink structure. Two combined heatsink structures are retained in a spaced apart arrangement by frame member(s) to form the chassis support structure. Each set of opposing heat exchanger modules defines at least one slot configured to slidingly receive electronic module(s) in the chassis support structure.

The improved thermal interface may be achieved by attaching (for example, via an adhesive) a Thermal Interface Material (TIM) on a heatsink plate coupled to each heat exchanger module. The TIM is used to circumvent surface features (for example, surface roughness, plating, flatness, etc.) of the heatsink plate material or Circuit Board (CB) material that have an effect on the resistance across the interface. The TIM provides an interstitial bridge between the abutting heat exchanger module and CB. This TIM arrangement overcomes microscopic discontinuities and reliance on cost prohibitive machining operations.

One or more spring-loaded glide mechanisms are used to protect the heatsink plate and/or TIM while the electronic module is being inserted into the chassis support structure, extracted from the chassis support structure, and/or otherwise moving within the chassis support structure. The glide mechanisms are coupled to the interchangeable heatsink members. The glide mechanisms are designed to prevent binding, galling or delamination of the TIM and/or heatsink plate during use of the electronic module so that foreign debris is not created in the system.

Referring now to FIG. 1, there is provided an illustration of a representative electronic system 100. The electronic system 100 comprises a structure 102 sized and shaped to receive one or more electronic modules 104. The structure 102 includes, but is not limited to, a chassis as shown, a card cage, a rack, a case, or a package. The electronic modules 102 include, but are not limited to, CBs or Printed Wiring Boards (PWBs) with a plurality of electronic components coupled thereto, traces formed thereon, and/or vias formed therethrough. The electronic components can include, but are not limited to, active components (e.g., processors and Integrated Circuit (IC) chips) and/or passive components (e.g., resistors, capacitors, inductors, etc.).

When being inserted into the structure 102, each electronic module 104 is slid into a slot 108 until mating connectors fully engage each other. The electronic module 104 is retained in position via sidewall 112. One or more injection/ejection mechanisms (not shown) may be provided to facilitate the extraction of the electronic module 104 from the structure 102. Any known or to be known injection/ejection mechanism can be used herein without limitation.

During use, the electronic modules 102 are air cooled via fan(s) of a fan module 110. The fan module 110 blows air through the main body 106 of the structure 102 in which the electronic modules 104 are housed and retained in a generally parallel or stacked arrangement. Heat is conducted from the electronic modules 104 to the walls 116, which are cooled by the air. The cool air causes heat to be carried out and away from the electronic system 100.

The electronic system 100 has an undesirable thermal interface between the electronic module(s) 104 and the walls 116. TIM(s) may be attached in each slot on the wall(s) 116. However, the TIMs produce foreign object debris in the electronic system 100 when the electronic modules 102 are being inserted into and removed from the slots 108. Incorporation of mechanisms to prevent this foreign object debris is costly and requires complex machining. The present solution provides a novel design for an electronic system which overcomes the cost and machining issues associated with this solution.

Figure 2:
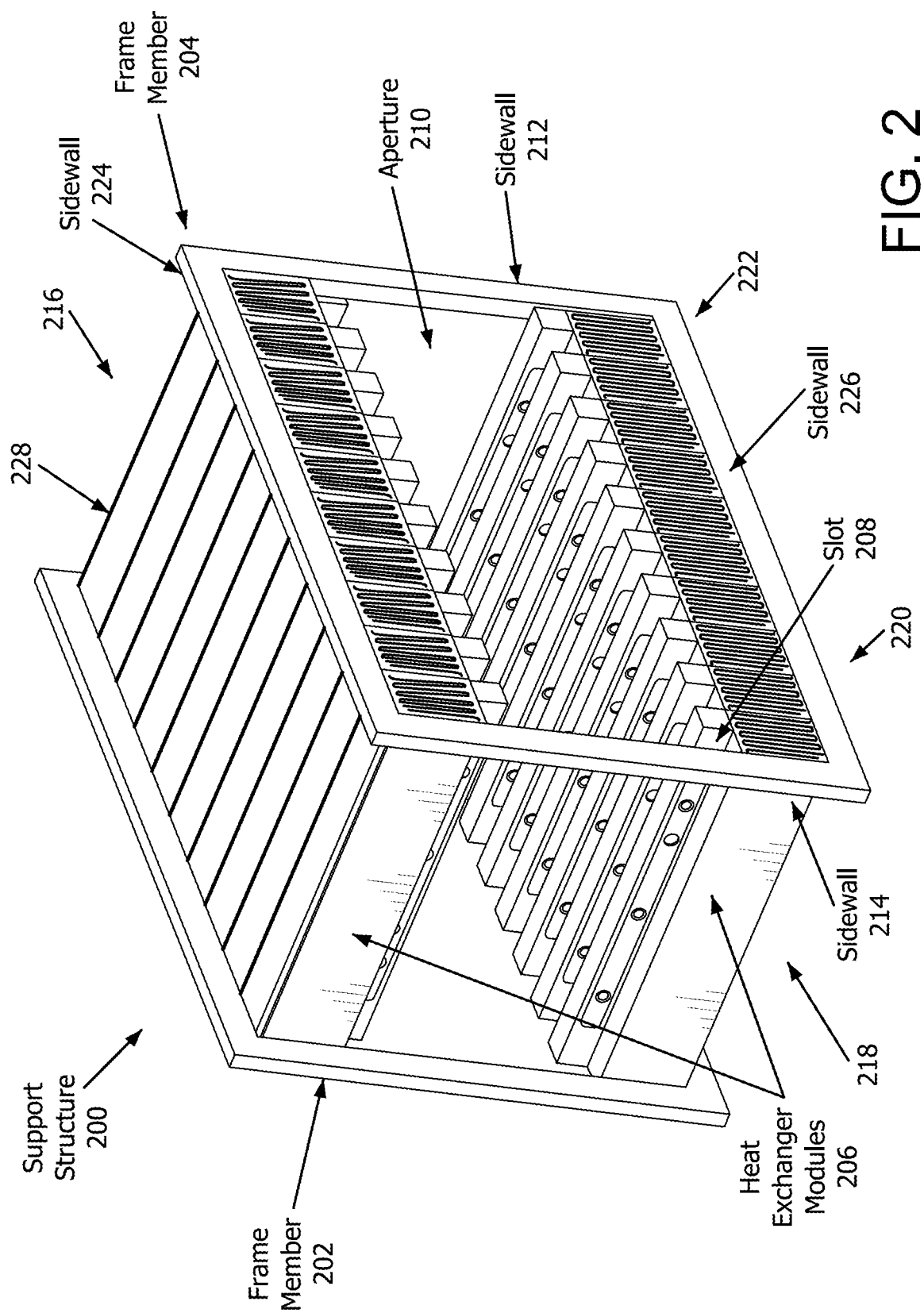
FIG. 2 provides a perspective view of a support structure of a high-performance air-cooled chassis for plug-in electronic modules.

Referring now to FIG. 2, there is provided a perspective view of a support structure 200. Support structure 200 can replace main body 106 in the electronic system 100 of FIG. 1. An exploded view of the support structure is provided in FIG. 3.

Support structure 200 comprises frame members 202, 204 and heat exchanger modules 206. Each frame member 202, 204 has a generally planer shape with an aperture 210 formed therein. The aperture 210 allows heat exchanger modules 206 to be inserted therethrough. The aperture 210 is sized and shaped to facilitate (i) a frictional engagement of sidewalls 212, 214, of the frame member 202 or 204 to the outer most heat exchanger modules of the upper and lower sets 216, 218 and (ii) a frictional engagement of sidewalls 224, 226 to surfaces 228 of the upper and lower sets 216, 218 of heat exchanger modules. In this way, each frame member surrounds and is in direct contact with at least three sides of the each set 216, 218 of heat exchanger modules. The frictional engagement allows the sets of heat exchanger modules to be retained in the spaced apart arrangement shown in FIG. 2 and allows the heat exchanger modules to be slidingly removed from the support structure 200. The heat exchanger modules may be interchangeable with other heat exchanger modules.

Although each set 216 and 218 is shown with ten heat exchanger modules, the present solution is not limited in this regard. Each set can include any number N of heat exchanger modules selected in accordance with a given application. N is an integer equal to or greater than one. Accordingly, the frame members 202, 204 can be adjustable to accommodate any number of upper and lower heat exchanger modules. The adjustment can be achieved via a sliding engagement of a first portion 220 of the frame member with a second portion 222 of the frame member. Any known or to be known technique for allowing two components to slide relative to each other can be used here (for example, a telescoping arrangement). The sliding engagement may allow the first portion 220 to be slid in and out of the second portion such that the size of the aperture 210 is selectively adjusted and set. A releasable mechanism (for example, a button or latch) can be provided to retain the first and second portions in a plurality of relative positions. Alternatively, the frame members can be exchanged with other frame members having different sizes for accommodating a different number of adjacent heat exchange modules. For example, first frame members can be provided that are designed to retain two sets of five heat exchanger modules, and second frame members can be provided that are designed to retain two sets of twenty heat exchanger modules. The present solution is not limited to the particulars of this example.

Slots 208 are provided when the upper and lower sets of heat exchanger modules 206 are fully inserted and retained by frame members 202, 204. The slots 208 are sized and shaped to slidingly receive electronic modules (for example, electronic modules 104 of FIG. 1), retain the electronic modules in a generally parallel arrangement when in a horizontal orientation or a stacked arrangement when in a vertical orientation, and allow the electronic modules to be removed from the slots.

Figure 3:
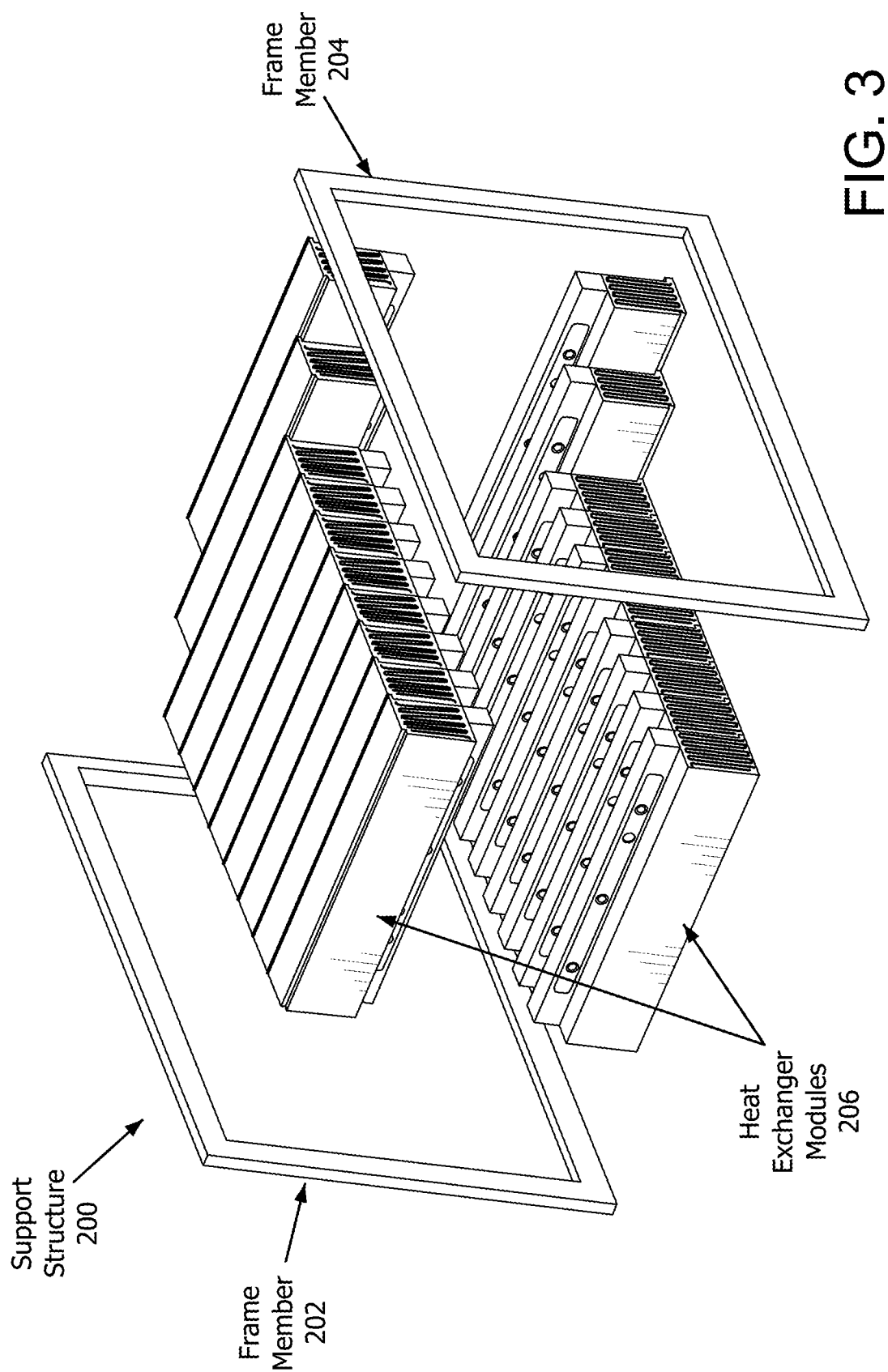
FIG. 3 provides an illustration that is useful for understanding how to assemble the support structure of FIG. 2.

As shown in FIG. 3, the heat exchanger modules 206 can be interlocked or otherwise coupled with each other to form the respective set 216 and 218 prior to being inserted into the frame members 202, 204. Alternatively, the interlocking or coupling can be achieved as the heat exchanger modules are inserted into the frame members in a one-piece at a time manner. The various manners in which the interlocking/coupling can be achieved will become evident as the discussion progresses. In some scenarios, the interlocking is achieved via sliding engagement between adjacent heat exchanger modules. The sliding engagement can, for example: cause two mating flanges to engage one another so as to couple adjacent heat exchanger modules to each other; or cause a protruding coupling structure of a first heat exchanger module to engage and slide in a cavity or track of a second adjacent heat exchanger module.

Figure 4:
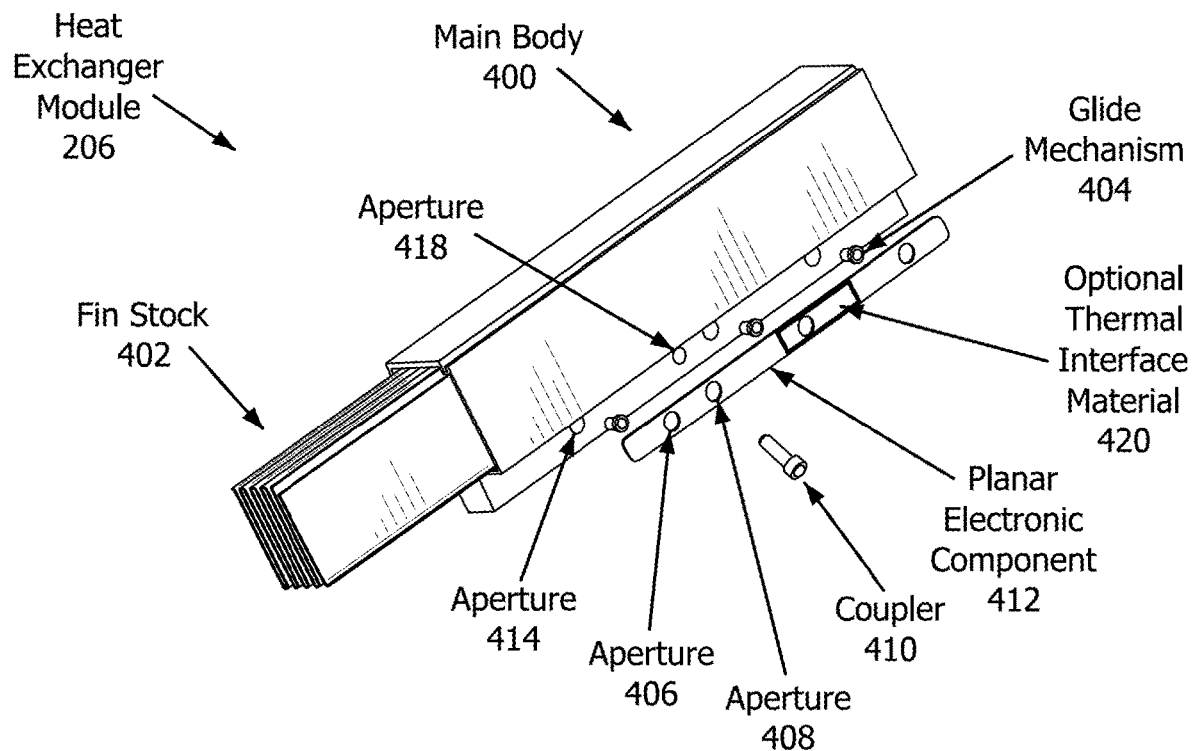
FIG. 4 provides an exploded view of a heat exchanger module shown in FIG. 2.
Figure 5:
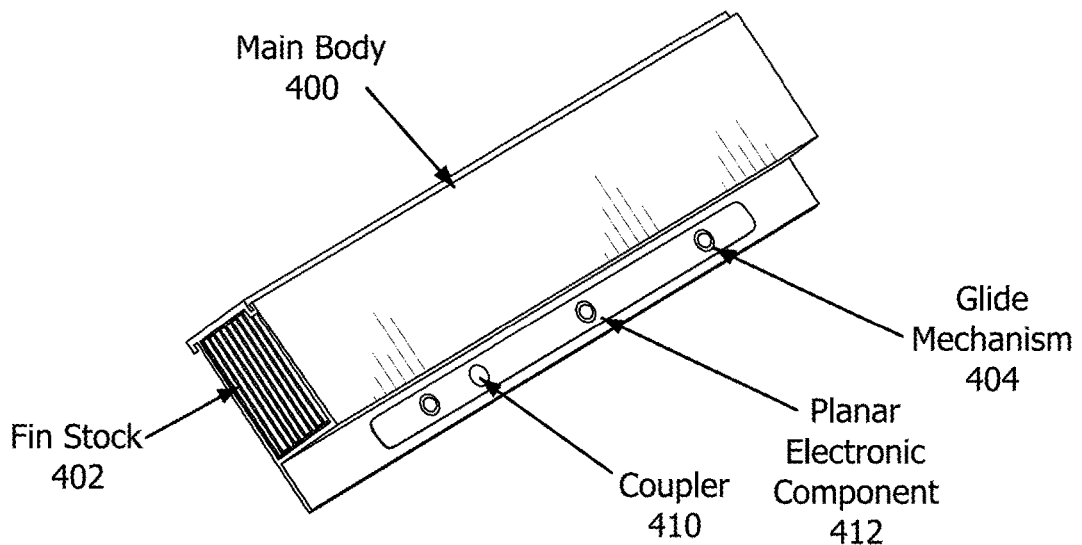
FIG. 5 provides an assembled view of the heat exchange module shown in FIG. 2 and FIG. 3.
Figure 6:
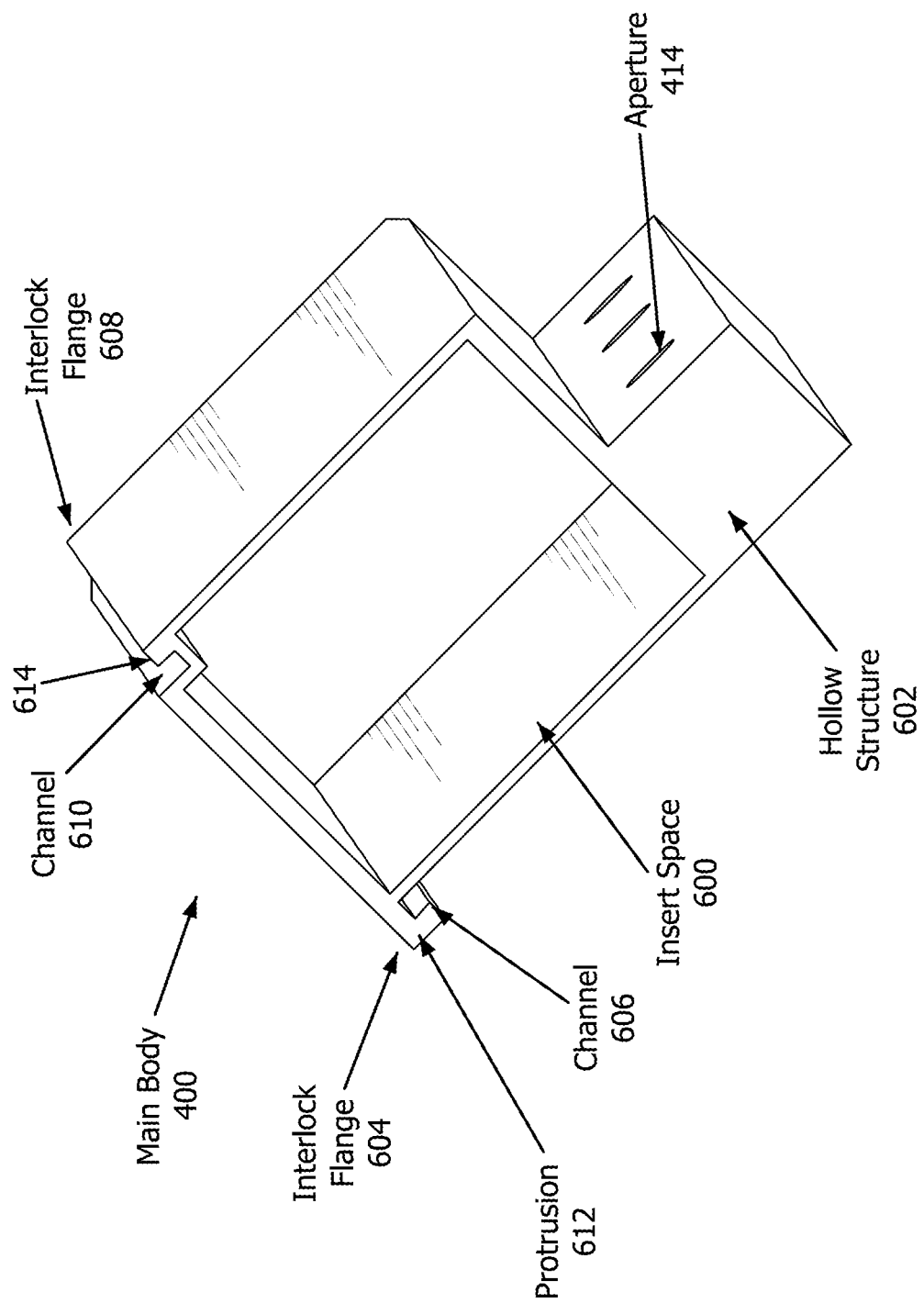
FIG. 6 provides a perspective view of the main body of the heat exchanger module shown in FIGS. 4-5.
Figure 7:
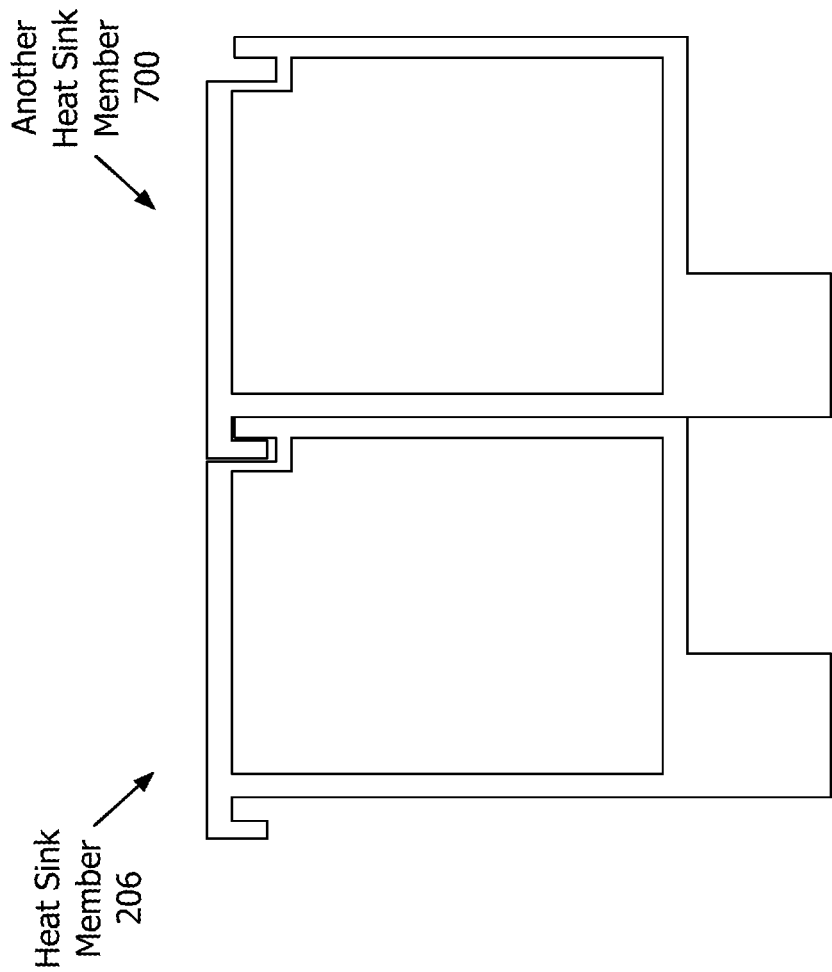
FIG. 7 provides an illustration showing two heat exchanger modules interlocked or otherwise coupled to each other.

More detailed illustrations of the heat exchanger module 206 are provided in FIGS. 4-6. The heat exchanger module 206 comprises a main body 400 with a fin stock 402 inserted in an insert space 600 provided therein. The main body 400 can be formed of a metal (for example, aluminum), any other thermally conductive material and/or any other extrudable material. The main body 400 may be extrusion cut to a pre-defined length. The main body 400 is machined, molded or otherwise formed to have interlock flanges 604, 608. The interlock flanges 604, 608 are configured to facilitate coupling of the heat exchanger module 206 with another adjacent heat exchanger module 700 as shown in FIG. 7. Interlock flange 608 has a channel 610 sized and shaped to slidingly receive a protrusion 612 of the adjacent heat exchanger module. Interlock flange 610 has a channel 606 to slidingly receive a protrusion 614 of another adjacent heat exchanger module. The sliding engagement cause the adjacent heat exchanger modules to interlock with each other as shown in FIG. 7.

The fin stock 402 may be dip-brazed during production. The fin stock 402 is shown in a partially inserted position in FIG. 4 and a fully inserted position in FIG. 5. The fin stock can include, but is not limited to, commercially available fin stock or specially machined fin stock. The overall design of the fin stock can be selected in accordance with a given application. Once fully inserted, the fin stock 402 may be coupled to the main body 400. This coupling can be achieved by, for example, brazing, a nano foil-based process, a thermally conductive film or a thermally conductive adhesive. The fin stock 402 may be unable to be removed or dislodged from the main body 400 when coupled thereto.

A planar electronic component 412 is also coupled to the main body 400. This coupling can be achieved by mechanical coupler(s) 410 (for example, screw(s)), adhesive(s) and/or weld(s). The mechanical coupler(s) 410 can be inserted through an aperture 406 of the planar electronic component 412 and threadingly engage threads of aperture 418 formed in the main body 400.

The planar electronic component 412 is configured to act as a passive heat exchanger that conducts or transfers heat generated by an electronic module to the main body 400 where it is dissipated into the ambient environment. This allows regulation of the electronic module temperature and/or support structure 200 at desired levels. In this regard, the planar electronic component 412 can be formed of a thermally conductive material such as metal (for example, aluminum). The planar electronic component 412 can include, but is not limited to, a heatsink plate.

A TIM 420 may be optionally coupled to the planar electronic component 412. The planar electronic component 412 and/or TIM 420 have apertures 406 formed therein to allow glide mechanism(s) 404 to at least partially pass therethrough. Apertures 406 are aligned with apertures 414 of the main body 400 so that the glide mechanism(s) can be housed in the main body 400 and transition between first positions in which they at least partially extend out from the components 400, 412, 420 and second positions in which they no longer extend out from components 412, 420. Notably, there is full access to the portion of the main body 400 for machining the apertures 414, 418 and installing the glide mechanism(s) 404 in the main body 400. This feature of the heat exchanger module facilitates improved fabrication cost and time as described herein.

At least one glide mechanism 404 is integrated with the planar electronic component at a location where the TIM resides. The glide mechanism(s) 404 prevent(s) the TIM from generating foreign object debris when the electronic module is being inserted into or extracted from the support structure 200. In this regard, the glide mechanism(s) 404 slide on a surface of the electronic module as it is being pushed into the support structure 200. Each glide mechanism 404 may partially extend out and away from the planar electronic component and/or TIM in a direction towards the electronic module while being slid along the electronic module. The TIM 420 and/or glide mechanism(s) 404 also act(s) as passive heat exchanger(s) that conduct(s) or transfer(s) heat generated by the electronic module to the main body 400 where it is dissipated into the ambient environment. This allows regulation of the electronic module temperature and/or support structure 200 at desired levels.

The glide mechanism(s) 402 include(s), but is(are) not limited to, spring-loaded plunger(s), spring-loaded ball bearing mechanism(s), leaf spring mechanism(s), and/or any other compressible mechanism. An illustration of a glide mechanism 800 comprising a spring-loaded plunger is provided in FIG. 8. An illustration of a glide mechanism 900 comprising a spring-loaded ball bearing mechanism is provided in FIG. 9. Each glide mechanism 402 of support structure 200 can be the same as or similar to glide mechanism 800 or glide mechanism 900. Both illustrative glide mechanisms 800, 900 are designed to: prevent the TIM elements 420 from sliding against the electronic module (for example, electronic module 104 of FIG. 1) while the electronic module is being inserted into and extracted from the support structure 200; provide a means for sliding across the electronic module while it is being inserted into and extracted from the support structure 200; allow the TIM elements 420 to come in direct contact with the electronic module when the electronic module is fully inserted into a slot 208 of the support structure 200; and allow the TIM elements 420 to be reusable.

Figure 8:
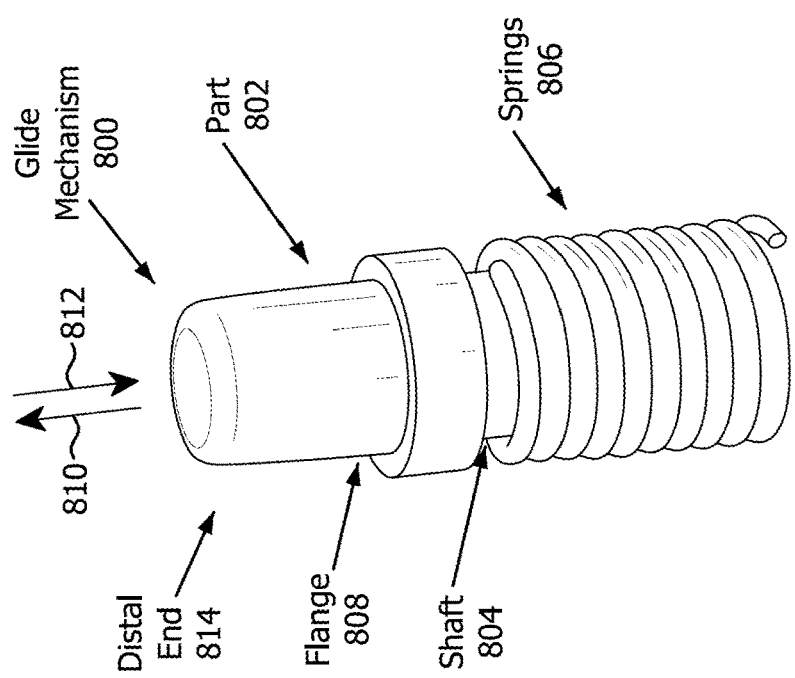

As shown in FIG. 8, the glide mechanism 800 comprises a part 802 having a shaft 804 on which a spring 806 is disposed. The part is provided with a flange 808 having a diameter greater than the diameter of the spring 806. The flange 808 provides a means for the part 802 to engage the spring 806 when depressed in a first direction 812. Such engagement causes compression of the spring 806 in the first direction 812. When the part 802 is released (i.e., is no longer being depressed), the spring 806 resiliently biases the part 802 in a second opposite direction 810. In this way, the glide mechanism 800 automatically transitions between a retracted position and an unretracted position.

The part 802 is formed of any suitable material, such as a thermoplastic or other durable material that is able to withstand wear or damage when slid against the electronic module a number of times. In some scenarios, a layer or coating (not shown) is disposed on the distal end 814 that has a relatively low coefficient of friction to facilitate an insertion and extraction of an electronic module from the support structure 200 with a relatively small amount of effort. The layer or coating includes, but is not limited to, Polytetrafluoroethylene, PTFE, or any number of non-stick derivatives. A typical coating of PTFE, commonly referred to by its well-known brand name Teflon, could be used in this application.

Also, the spring 806 is an interchangeable component. In this regard, the spring 806 can be interchanged with another spring having the same form factor but different stiffness. Such spring interchangeability allows the glide mechanism to be customized to any given application so that a desired sliding force or resistance is achieved.

Figure 9:
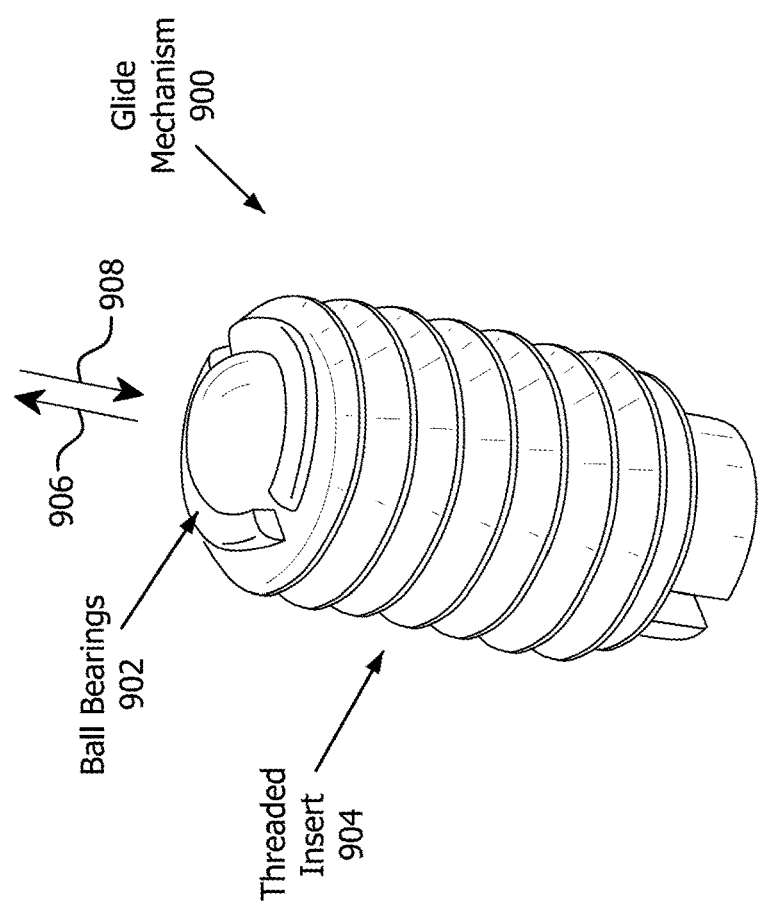
FIGS. 8 and 9 each provides an illustration of a glide mechanism.

As shown in FIG. 9, the glide mechanism 900 comprises a Commercial Off The Shelf (COTS) ball bearing based mechanism. More particularly, the glide mechanism 900 comprises a ball bearing 902 captivated in a threaded insert 904. A spring (not shown in FIG. 9) is also captured within the threaded insert 904 below the ball bearing 902. The spring resiliently biases the ball bearing 902 in a first direction 906. When a pushing force is applied to the ball bearing 902, it travels in a second opposing direction 908, and thereby retracts into the threaded insert 904. The spring automatically causes the ball bearing to return to its unretracted position when the pushing force is no longer being applied to the ball bearing.

Figure 10B:
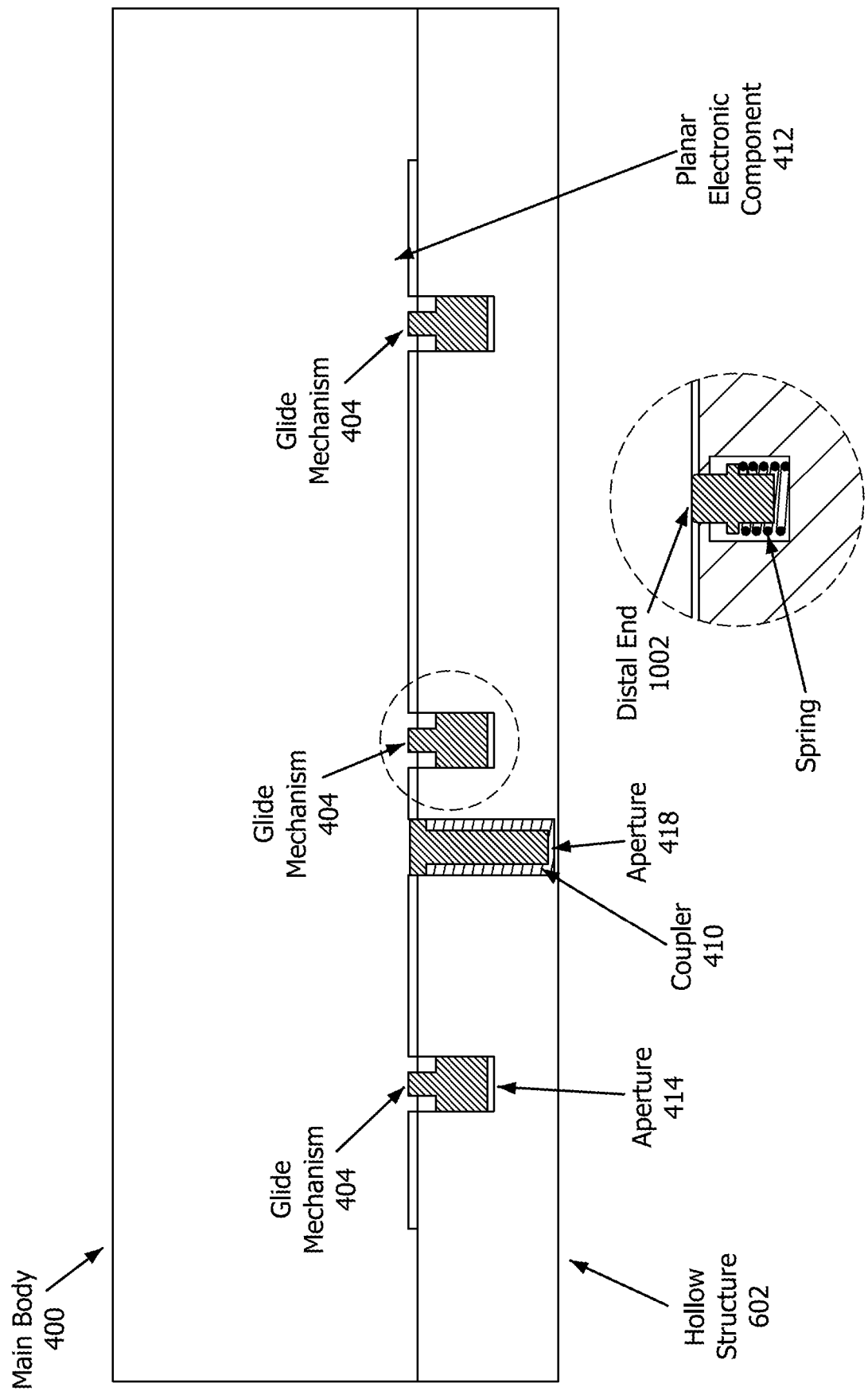

As shown in FIG. 10A and FIG. 10B, the spring (for example, spring 806 of FIG. 8 or the spring inside threaded insert 904 of FIG. 9) of the glide mechanism 404 are normally in an uncompressed state. Accordingly, the glide mechanism 404 is capable of transition between an unretracted position and a retracted position. When the glide mechanism 404 is integrated with a heat exchanger module (for example, heat exchanger module 206 of FIG. 2) and the spring is in the unretracted position, a distal end 1002 of the glide mechanism 404 protrudes out from the apertures 414 in a direction away from the planar electronic component 412 and/or TIM element(s) 420 as shown in FIG. 10A. In the retracted position, each glide mechanism 404 is retracted into the heat exchanger module such that the distal ends thereof no longer protrude out of the apertures 414, as shown in FIG. 10B.

Figure 11:
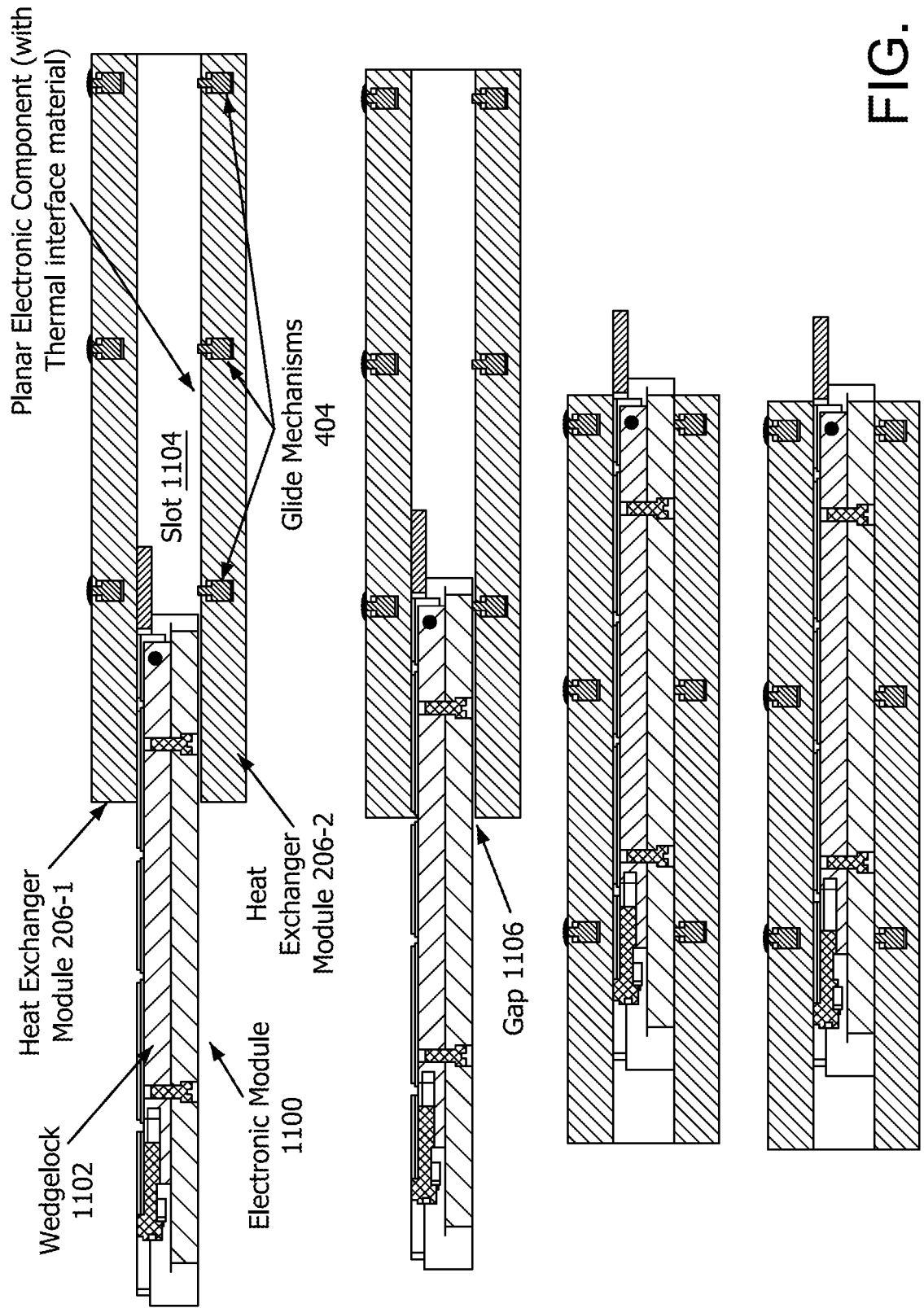
FIG. 11 provide illustrations showing an electronic module being inserted between two adjacent heat exchanger modules.

Referring now to FIG. 11, there are provided illustrations showing an electronic module 1100 being inserted in a slot 1104 formed between two adjacent heat exchanger modules 206-1, 206-2. Each glide mechanism 404 may remain in its undepressed state until the electronic module 1100 is fully inserted into the slot 1104 such that the planar electronic component and/or TIM does not come in direct contact with the electronic module while the electronic module travels into the slot. In regard, a gap 1106 is provided between the electronic module and planar electronic component/TIM while the electronic module is being slid into the slot 1104.

The planar electronic component and/or TIM comes in direct contact with the electronic module 1100 when a wedgelock 1102 is actuated for clamping the electronic module between the two adjacent heat exchanger modules 206-1, 206-2. Any known or to be known wedgelock can be used here. The wedgelock 1102 is mounted or otherwise coupled to the electronic module 1100. Each glide mechanism 404 transitions from its undepressed state to its depressed state as the wedgelock 1102 is being actuated for clamping the electronic module 1100 within the slot 1104.

The glide mechanisms 404 remain in their depressed state until the wedgelock is actuated for unclamping the electronic module. Once the electronic module 1100 is unclamped, it can be slid out of slot 1104. During this removal process, the glide mechanisms 404 cause a gap 1106 to once again exist between the electronic module 1100 and the planar electronic component and/or TIM. The gap 1106 ensures that foreign debris is not created by the planar electronic component and/or TIM as the electronic module is inserted in and out of the slot 1104.

Figure 12:
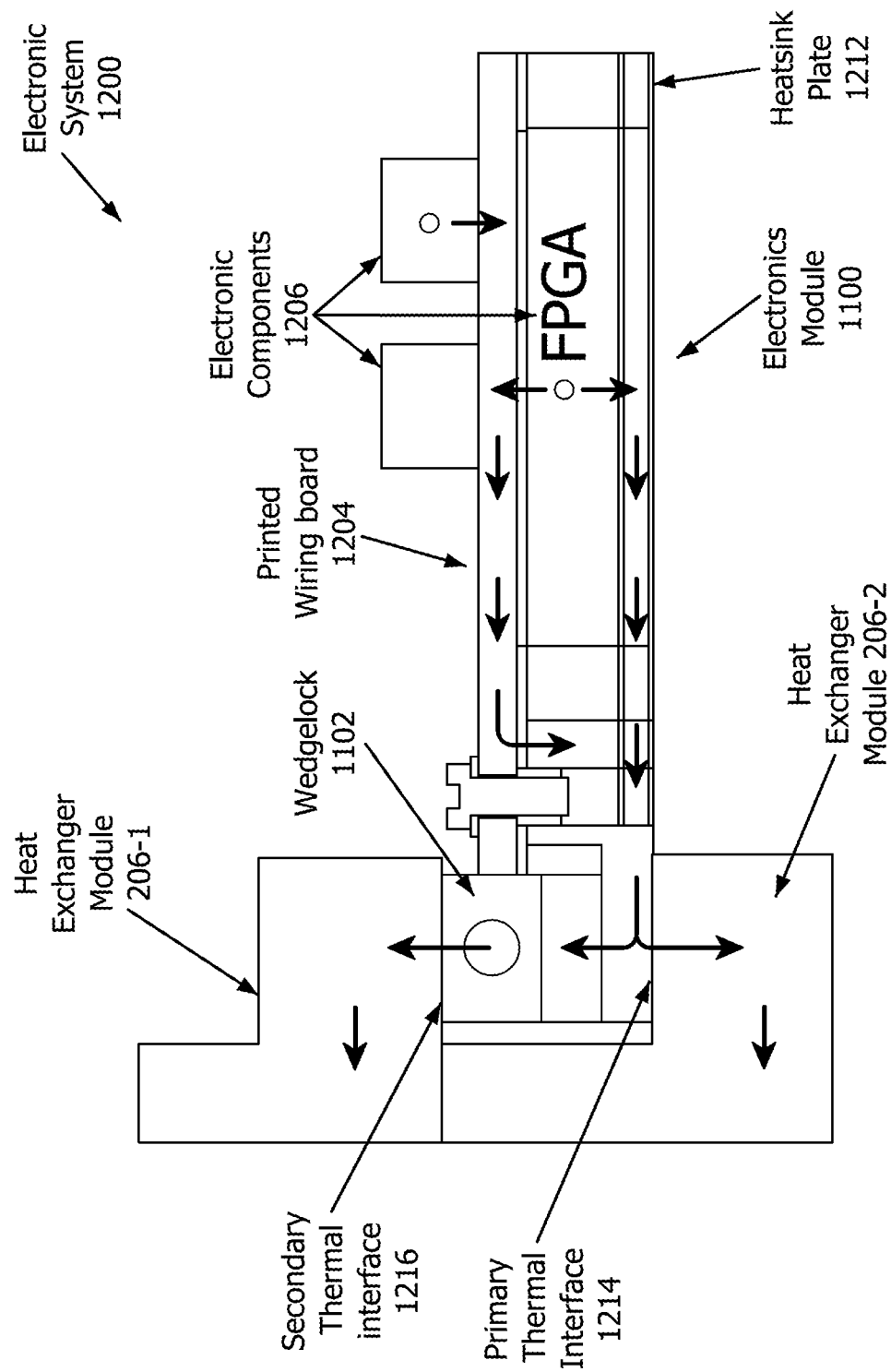
FIG. 12 is an illustration that is useful for understanding heat flow paths from a circuit board to an ambient environment.

FIG. 12 provides an illustration that is useful for understanding how heat flows from the electronic module 110 to the support structure 200. During operation, the electronic components 1206 on the PWB 1204 generate thermal energy that causes the temperature inside the support structure 200 to increase. This increase in temperature can result in damage to the PWB 1204 and the electronic components 1206 disposed on the PWB.

The temperature in the support structure 200 is decreased by dissipation or removal of heat from the PWB 1204 to the surrounding structure 1204 via a heatsink plate 1212, the wedgelock 1102, and heat exchanger modules 206-1, 206-2 (collectively referred to as heat exchanger modules 206). The components 1102, 1212, 206-1, 206-2 conduct heat away from the electronic components 1206 on the PWB 1204 to the support structure 200 for transfer to the ambient environment. Two heat flow paths are provided by the arrangement shown in FIG. 12. In accordance with a first heat flow path, heat travels from the PWB 1204 through the heatsink plate 1212 to the primary thermal interface 1214 and continues to the heat exchanger module 206-2. In accordance with a second heat flow path, heat travels from the PWB 1204 through the heatsink plate 1212 and wedgelock 1102 to the secondary thermal interface 1216 and continues to the heat exchanger module 206-1.

The thermal resistance at the primary thermal interface 1214 depends at least in part on the amount of force exerted by the wedgelock 1102 against heat exchanger module 206-1. A greater contact force applied by the wedgelock 1102 against a surface of the heat exchanger module 206-1 can decrease the thermal resistance at the primary thermal interface 1214. Such contact force is limited in its ability to reduce thermal resistance at the primary thermal interface 1214.

Despite the relatively large contact force applied by the wedgelock 1102 against the surface of the heat exchanger module 206-1, the heatsink material being clamped also has an effect on the resistance to heat transfer across the primary thermal interface 1214. In this regard, it should be understood that the thermal resistance is also typically a function of the physical characteristics of the clamped heatsink material (e.g., surface roughness, plating, flatness, etc.). In order to decrease this thermal resistance, the present solution can use one or more TIM elements to circumvent surface features of the material used to form the planar electronic component and/or heatsink plate 1212 that have an effect on the resistance across the interface. The glide mechanisms can also be designed to facilitate the transfer of heat to the primary heatsink interface 1214. The glide mechanisms are not shown in FIG. 12 for simplicity of illustration.

As evidenced from FIGS. 11-12, the glide mechanisms 404 can have multiple purposes. For example, the glide mechanisms 404 are configured to: facilitate an improvement in the thermal resistance at the heat exchanger module interface(s) 1214, 1216; and/or facilitate the transfer of heat at the primary heatsink interface 1214.

The present solution is not limited to the particular of support structure 200 and/or heat exchanger modules 206 described above. Other architectures for the same are shown in FIGS. 13-14.

Figure 13:
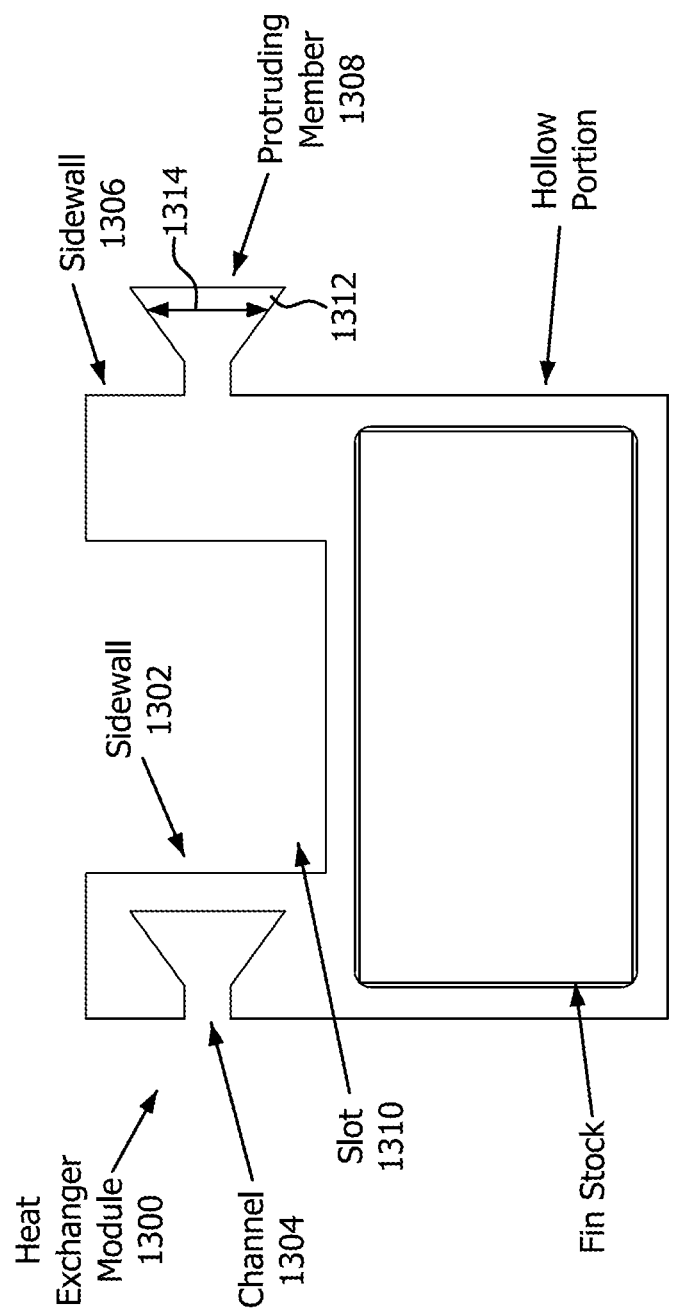
FIGS. 13-14 provide illustrations of another heat exchanger module.

With reference to FIG. 13, the heat exchanger modules can have other interlocking or coupling features than that discussed above and shown in FIGS. 3-7. In this regard, the heat exchanger modules 206 may be replaced with heat exchanger module 1300. Heat exchanger module 1300 is generally the same as or similar to heat exchanger module 206 except for the interlock or coupling features. The interlock or coupling features of heat exchanger module 1300 include: a protruding member 1308 securely coupled to a sidewall 1306 that is sized and shaped to be received and slid in an aperture, channel or track of an adjacent heat exchanger module; and a channel 1304 or track formed in an opposing sidewall 1302 that is sized and shaped to be slidingly receive a protruding member of an adjacent heat exchanger module. The protruding member 1308 can have a distend end 1312 with a variable width 1314. The channel 1304 can have a cross-sectional profile similar to that of the protruding member 1312. This design of the interlock features 1304, 1308 ensures that (i) the protruding member of an adjacent heat exchanger module is unable to be dislodged from the channel 1304 when the heat exchanger modules are in use and/or (ii) the protruding member 1308 does not dislodge from an aperture, channel or track of another adjacent heat exchange module when the heat exchanger modules are in use. A slot 1310 is at least partially defined by the sidewalls 1302, 1306. The slot 1310 is sized and shaped to receive an electronic module (for example, electronic module 1100 of FIG. 11).

Figure 14:
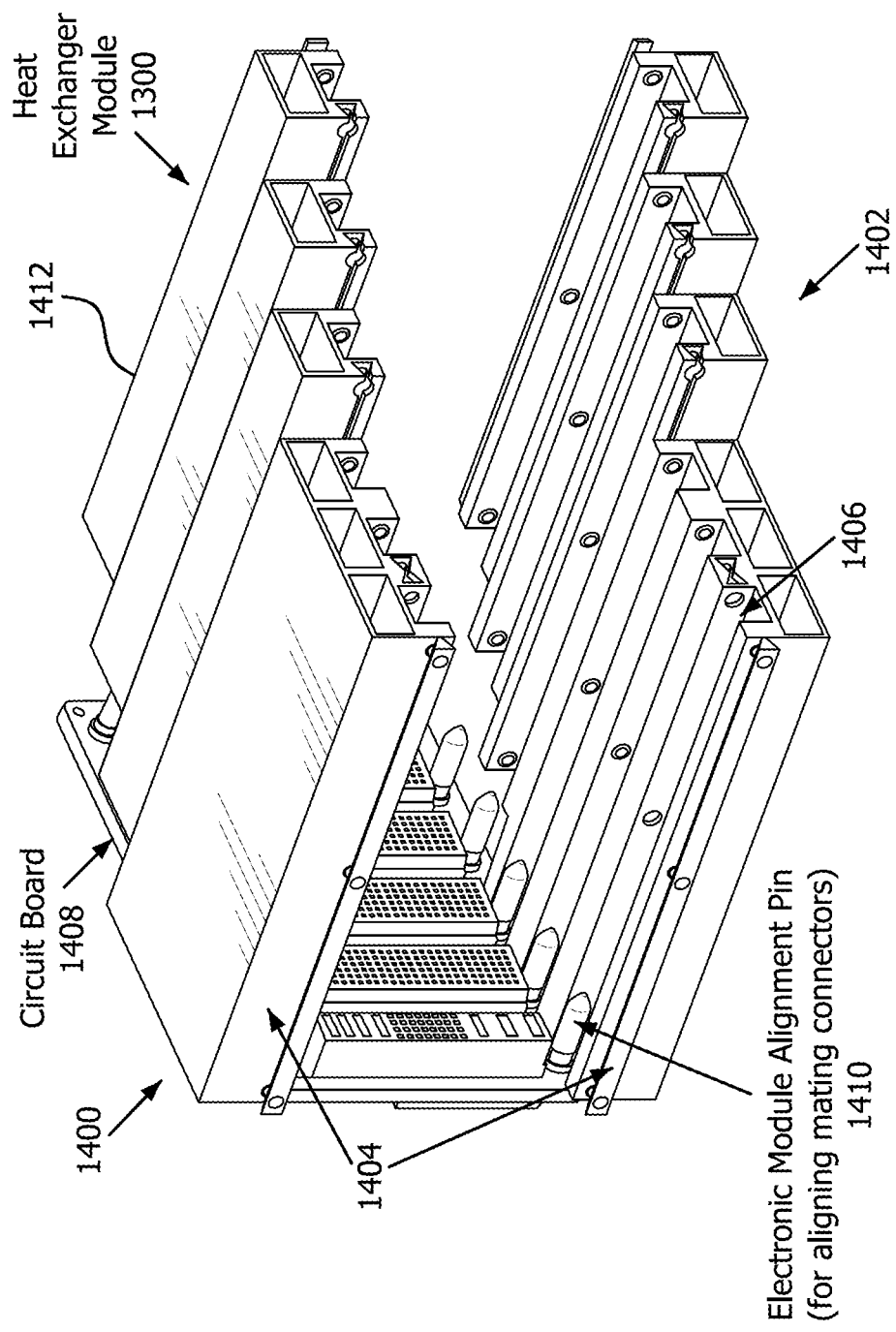

A plurality of the heat exchanger modules 1300 are shown in FIG. 14 being interlocked or coupled with each other so as to form an upper set of modules 1400 and a lower set of modules 1402. FIG. 14 also shows heat exchanger modules 1404 which are designed to have more than one slot 1406. In this regard, it should be understood that the heat exchanger modules of the present solution can be designed to have any number N of slots in accordance a given application, where N is an integer equal to or greater than one. In the multi-slot scenarios, the heat exchanger module can be formed via an insert mold-based process or a die casting process. During these two processes, a plurality of heat exchanger parts can be integrally formed with each other to form multiple slots. The multi-slot heat exchanger module is interchangeable with other heat exchanger modules with the same or different number of slots.

Figure 15:
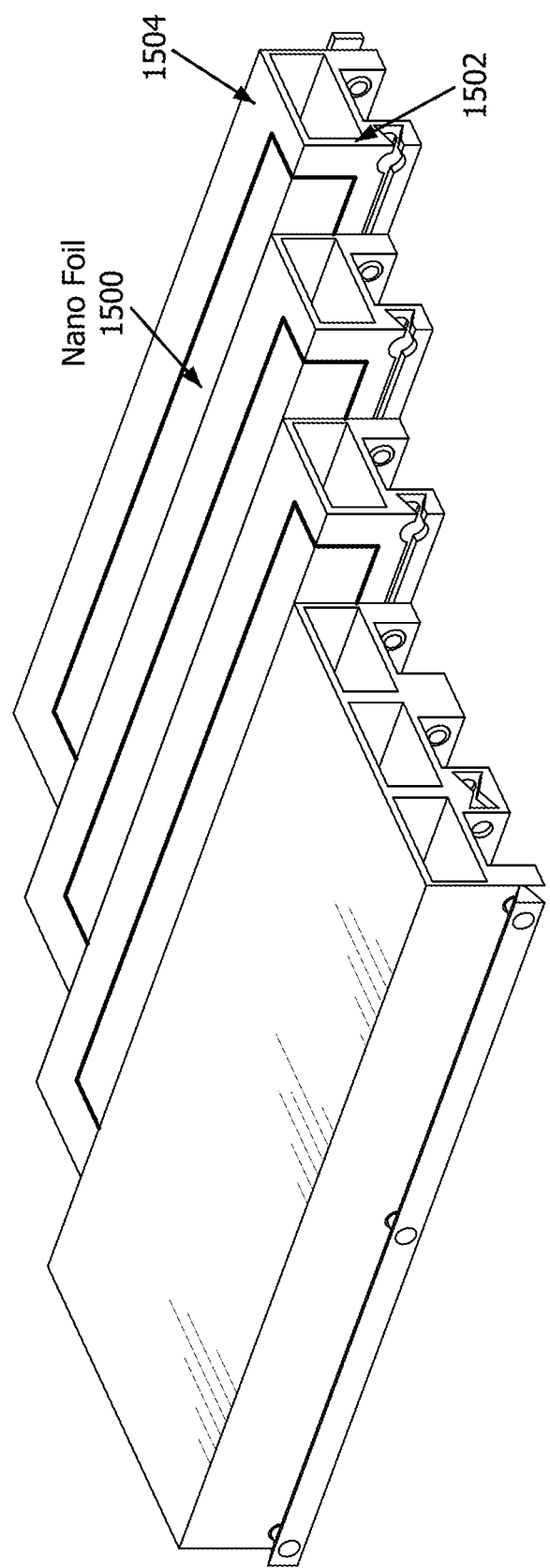
FIG. 15 provides an illustration showing two heat exchange modules being coupled to each other via a nano foil.

The heat exchanger modules 1300, 1400 may be securely coupled to each other after being interlocked with one another. The secure coupling can be achieved by, for example, a brazing process, a nano foil-based process, adhesive(s) and/or weld(s). The nano foil-based process can be understood with reference to FIG. 15. The nano foil-based process may generally involve: disposing a nano foil 1500 on surfaces 1502 located between adjacent heat exchanger modules and/or on top surfaces 1504 of the heat exchanger modules; and applying electrical current to the nano foil(s) 1500.

FIG. 16 provides a flow diagram of an illustrative method 1600 for facilitating temperature regulation of electronic module(s) (for example, electronic module 104 of FIGS. 1 and/or 1100 of FIG. 11). Method 1600 begins with 1602 and continues with 1604 where a plurality of heat exchanger modules (for example, heat exchanger modules 206 of FIG. 2, heat exchanger modules 206-1, 206-2 of FIG. 2, heat exchanger module 700 of FIG. 7, heat exchanger module 1300 of FIG. 13, and/or heat exchanger modules 1404 of FIG. 4) are obtained. The heat exchanger modules have interlock features (for example, interlock flanges 604, 608 of FIG. 6 and/or features 1304, 1308 of FIG. 13). The interlock features are used in 1606 to interlock or otherwise couple the heat exchanger modules together into two sets (for example, set(s) 216, 218 of FIG. 2 and/or set(s) 1400, 1402 of FIG. 14). The heat exchanger modules of each set may optionally be securely coupled to each other, for example, via a brazing process, a nano foil-based process, adhesive(s) and/or weld(s).

Frame members (for example, frame members 202, 204 of FIG. 2) are used in 1610 to structurally support and maintain first and second sets of heat exchanger modules in a spaced apart arrangement (for example, as shown in FIG. 2). In the spaced apart arrangement, a plurality of slots (for example, slots 208 of FIG. 2, slot 1104 of FIG. 11, slot 1310 of FIG. 13 and/or slots 1406 of FIG. 14) are provided for housing electronic modules.

In 1612, an electronic module (for example, electronic module 104 of FIGS. 1 and/or 1100 of FIG. 11) is received in a slot formed by the first and second sets of heat exchanger modules. The electronic module is then pushed or otherwise inserted into the slot. Glide mechanism(s) (for example, glide mechanism(s) 404 of FIG. 4, 800 of FIG. 8, and/or 900 of FIG. 9) slide on the electronic module as the electronic module is being inserted into the slot, as shown by 1614. The glide mechanism(s) is(are) used in 1616 to prevent or at least minimize the amount of direct content between the electronic module and a thermal interface member. The thermal interface member can include, but is not limited to, a planar electronic component (for example, planar electronic component 412 of FIG. 4) and/or TIM(s) (for example, TIM 420 of FIG. 4).

In 1618, a coupler (for example, wedgelock 1102 of FIG. 11) is actuated to secure the electronic module to the structure (for example, structure 200 of FIG. 2) and to sandwich the thermal interface member between the electronic module and heat exchanger module(s). The glide mechanism(s) are caused and allowed to be retracted into the respective heat exchanger module while the coupler is being actuated.

The electronic module may be released from the structure by actuating the coupler as shown by 1622. In 1624, the glide mechanism(s) is(are) caused and allowed to automatically return to a partially unretracted position while the coupler is being actuated to release the electronic module from the structure. The glide mechanism(s) slide on the electronic module in 1626 as the electronic module is being pulled or otherwise extracted from the structure. The electronic module is removed from the structure in 1628. In 1630, the glide mechanism(s) is(are) allowed to automatically return to its(their) fully unretracted position(s).

Next in 1632, at least one heat exchanger module of the first and/or second sets is optionally replaced or otherwise interchanged with another heat exchanger module. Subsequently, method 1600 can return to 1610 or 1612.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for facilitating temperature regulation of an electronic module, comprising:
    coupling first heat exchanger modules of a plurality of heat exchanger modules together to form a first set of heat exchanger modules and second heat exchanger modules of the plurality of heat exchanger modules together to form a second set of heat exchanger modules;
    using frame members to structurally support and maintain the first and second sets of heat exchanger modules in a spaced apart arrangement; and
    providing at least one slot between corresponding spaced apart modules of the first and second heat exchanger modules, the at least one slot being sized and shaped to receive the electronic module to facilitate the temperature regulation via the plurality of heat exchanger modules.

2. The method according to claim 1, wherein the coupling comprises slidingly receiving a heat exchanger module of the plurality of heat exchanger modules in a channel of another heat exchanger of the plurality of heat exchanger modules.

3. The method according to claim 1, wherein the coupling comprises interlocking adjacent ones of the first or second heat exchanger modules to each other.

4. The method according to claim 3, wherein the coupling further comprises securely joining the first heat exchanger modules to each other and the second heat exchanger modules to each other via brazing after the interlocking.

5. The method according to claim 1, further comprising:
receiving the electronic module in the at least one slot;
sliding at least one glide mechanism on the electronic module as the electronic module is being inserted into the at least one slot; and
using the at least one glide mechanism to prevent direct contact between the electronic module and a thermal interface member disposed on one of the corresponding spaced apart modules.

6. The method according to claim 5, further comprising allowing the thermal interface member to be sandwiched between the electronic module and one of the corresponding spaced apart modules.

7. The method according to claim 6, further comprising allowing the glide mechanism to be retracted into one of the corresponding spaced apart modules as the thermal interface module is being sandwiched between the electronic module and one of the corresponding spaced apart modules.

8. The method according to claim 1, wherein the first and second heat exchanger modules are interchangeable with third heat exchanger modules of the plurality of heat exchanger modules.

9. The method according to claim 8, further comprising replacing one of the first or second heat exchanger modules with one of the third each exchanger modules.

10. A structure, comprising:
at least one frame member;
a plurality of heat exchanger modules coupled together to form first and second sets of heat exchanger modules; and
a thermal interface member coupled to each said heat exchanger module, the thermal interface member configured to facilitate temperature regulation of an electronic module when the electronic module is disposed in the structure;
wherein the at least one frame member structurally supports and maintains the first and second sets of heat exchanger modules in a spaced apart arrangement such that at least one slot is provided in the structure that is sized and shaped to receive the electronic module; and
wherein each said heat exchanger module comprises a main body that is formed of a thermally conductive material and has at least one first structural feature configured to engage a second structural feature of another one of the heat exchanger modules to facilitate formation of the first or second sets of heat exchanger modules.

11. The structure according to claim 10, wherein the heat exchanger modules are interchangeable with each other.

12. The structure according to claim 10, wherein a size of the at least one frame member is adjustable to accommodate different sized sets of heat exchanger modules.

13. The structure according to claim 12, wherein at least one heat exchanger module is removed or added to each of the first and second sets after being structurally supported by the at least one frame member and prior to when the size of the at least one frame member is adjusted.

14. The structure according to claim 10, wherein the at least one frame member surrounds and frictionally engages at least three sides of each said first and second sets of heat exchanger modules.

15. The structure according to claim 10, wherein the plurality of heat exchanger modules is configured to regulate a temperature of the electronic module when the electronic module is disposed in the structure.

16. The structure according to claim 10, wherein the at least one second structural feature is configured to slidingly receive the at least one first structural feature to cause an interlocking between two adjacent heat exchanger modules.

17. The structure according to claim 10, further comprising at least one glide mechanism disposed in the main body of each said heat exchanger module, the at least glide mechanism transitionable between an unretracted position in which a portion of the glide mechanism protrudes out and away from the main body and a retracted position in which the position of the glide mechanism is retracted into the main body.

18. The structure according to claim 10, wherein the at least one glide mechanism is configured to prevent the electronic module from directly contacting the thermal interface member when being inserted and removed from the at least one slot.

19. The structure according to claim 18, wherein the thermal interface member is coupled to the heat exchanger module at a location to allow the thermal interface member to be sandwiched between the electronic module and the heat exchanger module when the heat exchanger module is disposed in the structure.

20. The structure according to claim 19, wherein the at least one glide mechanism is configured to transition to the retracted position when the thermal interface module is being sandwiched between the electronic module and the heat exchanger module.

* * * * *